United States Patent [19]
Gee et al.

[11] Patent Number: 5,856,970
[45] Date of Patent: Jan. 5, 1999

[54] MULTI-CHANNEL ECHO CANCELLATION METHOD AND APPARATUS

[75] Inventors: Donald Fong Gee; Bruce Edward Geren, both of Chandler; James Brian Piket, Gilbert; William Chunhung Yip, Scottsdale, all of Ariz.

[73] Assignee: Motorola, Inc., Schaumburg, Ill.

[21] Appl. No.: 692,353

[22] Filed: Aug. 5, 1996

[51] Int. Cl.$^6$ .................................................. H04B 3/23
[52] U.S. Cl. .......................................... 370/286; 379/410
[58] Field of Search ...................... 370/286–292; 379/3, 344, 345, 402, 403, 406, 407, 410, 411; 455/39, 63, 569, 570; 364/724.07, 724.11, 724.12, 724.13, 724.19, 724.16

[56] References Cited

U.S. PATENT DOCUMENTS

| | | | |
|---|---|---|---|
| 4,129,753 | 12/1978 | Duttweiler | 379/410 |
| 4,742,510 | 5/1988 | Quatierei, Jr. et al. | 370/290 |
| 5,001,701 | 3/1991 | Gay | 379/410 |
| 5,247,512 | 9/1993 | Suggaya et al. | 370/289 |
| 5,295,136 | 3/1994 | Ashley et al. | 370/290 |
| 5,511,064 | 4/1996 | Oh et al. | 379/406 |
| 5,684,792 | 11/1997 | Ishihara | 370/286 |

FOREIGN PATENT DOCUMENTS

WO92/02994  2/1992  WIPO ............................ H04B 3/20

OTHER PUBLICATIONS

INSPEC abstract of Journal article: ECHO2, a multi–channel single–chip, VLSI–ECHO canceller with embedded TMS320C10 DSP by Prysby et al on pp. 100–13 in IEEE, New York, USA, Sep. 1993.

INSPEC abstract of Journal article: A microprocessor based adaptive digital echo canceller by McDevitt, E.J. in NTC '80. IEEE 1980 National Telecommunications Conference, p. 56. 4 1–4, IEEE, New York, USA, 1980.

*Primary Examiner*—Ajit Patel
*Assistant Examiner*—Seema S. Rao
*Attorney, Agent, or Firm*—Dana B. LeMoine

[57] ABSTRACT

An echo canceller (500) utilizes a central control unit (502) (CCU) and at least one convolution processing unit (504) (CPU) to perform echo cancellation on one or more channels. A method for operating the echo canceller (500) controls reading (706) one or more reference signals (510) and reflected signals (512), convolution and adaptive processing (11, 21, 31, 41) using the CPUs (504), and post-processing (702) to produce one or more echo cancelled signals (514). Convolution and adaptive processing for multiple channels can be performed simultaneously (11, 31) by multiple CPUs (504), or in a time-multiplexed manner (11, 21) by a single CPU (504), or a combination (11, 21, 31, 41) of simultaneous and time-multiplexing by multiple CPUs (504). CCU (502) is able to perform processing functions (702–730) while CPUs (504) perform convolution and adaptive processing (11, 21, 31, 41).

27 Claims, 6 Drawing Sheets

MULTI-CHANNEL ECHO CANCELLATION METHOD AND APPARATUS

FIELD OF THE INVENTION

The present invention relates generally to echo cancellation of voice signals and, more particularly, to echo cancellation for multiple voice channels.

BACKGROUND OF THE INVENTION

The portion of the telephone network which connects each individual subscriber to a central office serving that subscriber uses a two-wire subscriber loop. At the central office, the incoming and outgoing signals are transmitted on a four-wire circuit. The subscriber telephone, the two-wire connecting pair, and a hybrid coil at the central office form a balanced bridge circuit such that the hybrid coil separates the incoming and outgoing signals at the two- to four-wire conversion point.

An effective impedance imbalance of the bridge circuit can cause a substantial portion of the remote speaker's signal to be returned to him or her in the form of an echo. The "source" of the echo is the hybrid itself, although other echo sources also can exist. The distance between the remote speaker and the bridge circuit is proportional to the round-trip delay time and also proportional to the effects of the echo. Where satellite links form a part of the communication path, for example, the effect of the echo can be severe.

The effects of echo can be reduced using an echo suppressor or an echo canceller. An echo suppressor is effective for circuits of up to a few thousand miles in length. The echo suppressor detects which direction of the conversation is active at any given time and inserts attenuation in the opposite direction, thus breaking the round-trip path and attenuating the echo.

An echo canceller is more effective for longer circuits. One type of echo canceller consists of a transversal filter connected between the two paths. Using the incoming signal as input, the filter taps are adjusted to replicate the portion of the signal that leaks through the hybrid coil. The replicated signal is then subtracted from the outgoing signal, effectively canceling the echo. Commonly, echo cancellers apply a least-mean-squares (LMS) filter adaptation algorithm to estimate the effects of the echo.

Where multiple communication channels are supported, prior-art systems use a Digital Signal Processor (ASP) with associated memory and support circuitry to support signal processing, including echo cancellation, for each channel. Commercial products that provide echo canceling functions include the AT&T Echo Canceller (Universal), Tellabs Echo Canceller (2531A), Coherent Echo Canceller (EC-6000), and the DSC Echo Canceller (EC-24). Prior-art echo cancellers have long delays because they use DSPs to perform echo cancellation and, often, to perform multiple other signal processing functions. Thus, because of clock limitations, prior-art echo cancellers typically cannot perform all calculations in a direct sequence real-time manner, and must buffer data to accommodate periodic increases in processing demands without losing data As communication systems have become increasingly digital, these component delays, which result from algorithm and implementation inefficiency, as well as limitations of vendor DSP chip sets have increasingly become a problem What is needed is a method and apparatus which solves echo cancellation algorithm and implementation efficiency problems of the prior art Further needed is a method and apparatus which does not require dedicated component resources for echo cancellation on every communication channel. Further needed is a method and apparatus which provides full featured echo cancellation with a very short delay in the communication path.

DETAILED DESCRIPTION OF THE DRAWINGS

The method and apparatus of the present invention solves algorithm and implementation efficiency problems with prior-art echo cancellation techniques. The implementation of the method and apparatus of the present invention results in real-time processing, small system through-put delay, a realizable operating frequency (e.g., 20 MHz), and realizable gate usage. The method and apparatus of the present invention also enables multiple independent voice channels to be processed in real-time. Further, the method and apparatus of the present invention provides full featured echo cancellation with a very short delay (e.g., less than 0.5 ms) in the communication path.

For illustrative purposes, the method and apparatus of the present invention is described in the context of a communication system having wireless and land-line networks. However, the method and apparatus of the present invention can be applied within any communication system which uses echo cancellation to reduce echo. Potential applications for the use of this invention include any land-line or wireless telephony system.

Figure 1:
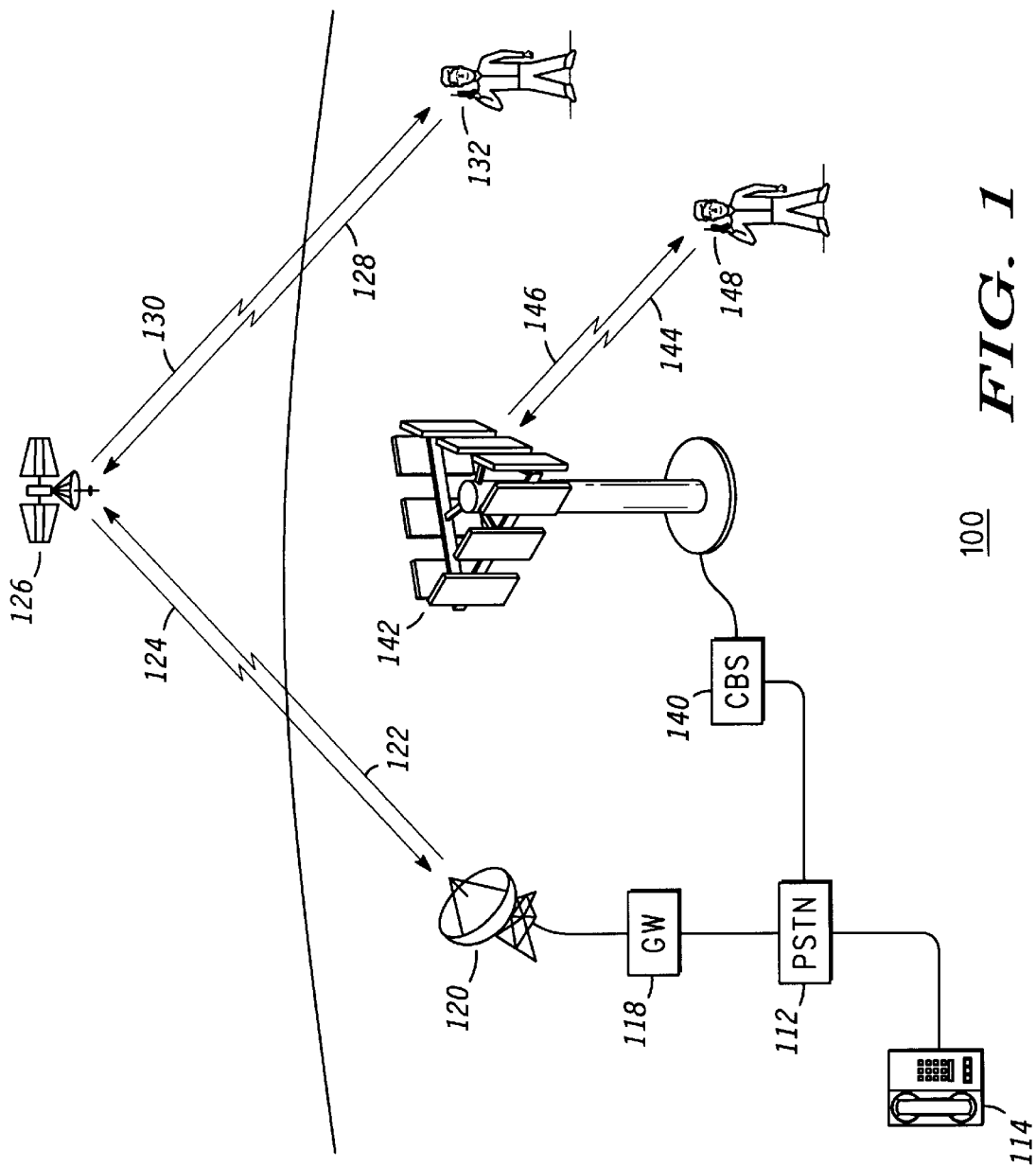
FIG. 1 illustrates a communication system in accordance with a preferred embodiment of the present invention.

FIG. 1 illustrates communication system 100 in accordance with a preferred embodiment of the present invention. Communication system 100 includes at least one land-line network, such as Public Switched Telephone Network 112 (PSTN), which provides service to land-line equipment 114 which can be, for example, telephone, facsimile, or data equipment PSTN 112 interfaces with at least one cellular network which can be ground-based or satellite-based, or a combination of both. FIG. 1 illustrates both types of networks for exemplary purposes. A satellite network includes a gateway 118 (GW) which, via satellite antenna 120, maintains gateway uplink 122 and/or gateway downlnk 124 with at least one satellite 126. Satellite 126, in turn, maintains user uplink 128 and/or user downlink 130 with at least one communication unit 132 (CU) which can be, for example, a cellular telephone, radio, facsimile, or data device. Although only one satellite 126 is shown for illustrative purposes, the satellite network could include multiple satellites, and signals between GW 118 and CU 132 could be routed through one or more satellites using direct cross-links between satellites, or bent-pipe links between satellites and ground relay stations.

A ground-based network includes cellular base station 140 (CBS) which, via cellular antenna 142, maintains user uplink 144 and/or user downnk 146 with at least one CU 148, which can be, for example, a cellular telephone, radio, facsimile, or data device. CUs 132, 148 could be capable of communication only with their respective type of network, or could be multi-mode CUs which can communicate with networks having differing air interfaces.

Various echo sources could exist within communication system 100. For example, the hybrid circuit separating the four-wire and two-wire circuits of PSTN 112 is likely an echo source. Other echo sources could be located at GW 118 and/or CBS 140. Wherever an echo source is present, the method and apparatus of the present invention could be applied to reduce the effects of the echo and increase communication quality.

Figure 2:
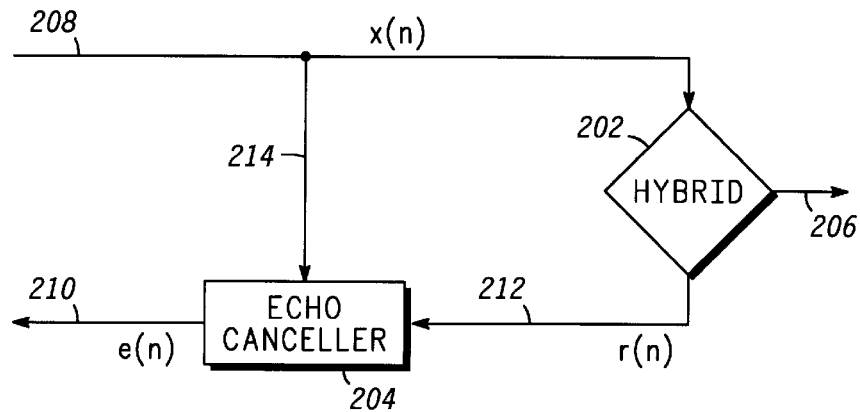
FIG. 2 illustrates a prior-art model of an echo source and placement of an echo canceller to minimize the echo in the return loop.

FIG. 2 illustrates a prior-art model of an echo source and placement of echo canceller 204 to minimize the echo in the return loop. The model includes a four-wire loop which is defined by incoming line 208 which carries a reference signal, x(n), and outgoing lines 210, 212. For example, reference signal, x(n), could originate from a wireless device (e.g., CU 132, 148, FIG. 1).

Hybrid 202 represents an echo source and separates the four-wire loop from two-wire line 206. For example, two-wire line 206 could carry a signal from a subscriber telephone (e.g., land-line equipment 114, FIG. 1). A reflected signal, r(n), which results from an impedance mismatch of the hybrid circuit occurs on outgoing line 212. Echo canceller 204 is placed between outgoing lines 210 and 212 in order to cancel the effects of the reflected signal.

As will be explained in detail below, echo canceller 204 receives the reference signal on line 214 and the reflected signal on line 212 and produces an echo canceled signal, e(n), which is applied to outgoing line 210.

Figure 3:
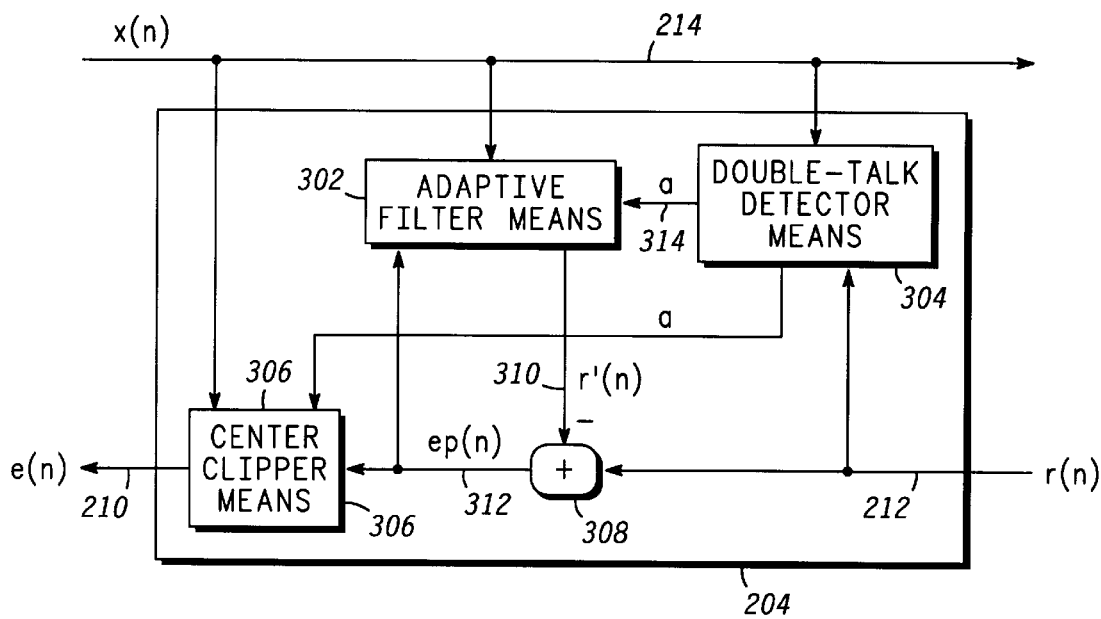
FIG. 3 illustrates a prior-art functional block diagram of an echo canceller.

FIG. 3 illustrates a prior-art functional block diagram of echo canceller 204. Echo canceller 204 includes three main components: adaptive filter means 302, double-talk detector means 304, and center clipper means 306. Echo cancellation can be viewed as a problem in system identification and modeling where, for example, the system that needs to be modeled could include a hybrid (e.g., hybrid 202, FIG. 2). The primary functions of the echo canceller, including echo impulse response modeling and subsequent echo estimation, are performed by adaptive filter means 302.

Adaptive filter means 302 receives reference signal, x(n), on line 214. Adaptive filter means 302 then attempts to model the actions of the echo source on the reference signal x(n), and produces an estimate, r'(n), of the reflected signal r(n). The signal estimate, r'(n), is output on line 310. Adaptive filter means 302 is described in more detail in conjunction with FIG. 4.

Summer means 308 receives the signal estimate, r'(n), on line 310 and the reflected signal, r(n), on line 212. Summer means 308 subtracts the signal estimate, r'(n), from the reflected signal, r(n), to produce a pre-clip error signal, ep(n) which is output on line 312. The pre-clip error signal, ep(n), is presented as a feedback signal to adaptive filter means 302 via line 312. As will be explained in detail below, the feedback signal is used by adaptive filter means 302 to update the filter coefficients, which represent the echo impulse response model. After a certain period of convergence, the filter coefficients closely represent the actual echo impulse response, and the feedback signal is ideally zero.

Center clipper means 306 monitors the zero lag autocorrelation, or average power, of the reference signal, x(n), received on line 214, and the pre-clip error signal, ep(n), received on line 312. When center clipper means 306 determines that the filter has sufficiently converged and double-talk (described below) is not present, center clipper means 306 performs a non-linear echo suppression process to eliminate any remaining reflected signal, thus minimizing the audible effects of short-term filter divergence. The echo canceled signal, e(n), is then output on line 210.

Double-talk detector means 304 monitors the average power of the reference signal, x(n), on line 214, and the reflected signal, r(n), on line 212, to determine if the "near-end" signal is active. A period when the near-end signal is active is commonly referred to as double-talk. During double-talk, double-talk detector means 304 disables the filter adaptation process, via a signal on line 314, performed by adaptive filter means 302 in order to prevent divergence of the filter coefficients. Double-talk detector means 304 also disables the center clipper during double-talk conditions to allow the near-end signal to be passed.

Echo canceller 204 uses Concentrated Section LMS (CSLMS) techniques, which are described in U.S. Pat. No. 5,295,136. CSLMS has been shown to have better filter convergence properties than LMS. However, concentrated section techniques require that the significant components of the echo impulse response can be modeled over a limited range (i.e., a "concentrated section"). If such condition is not met, such as during multi-peak echo conditions, adaptive filter means 302 switches to performing normalized LMS. As used herein, a "multi-peak" echo condition occurs when there are multiple echo sources (e.g., land-line telephony equipment 114 and PSTN 112, FIG. 1), or when the echo does not fit within a concentrated section (i.e., the echo is widely dispersed).

The method and apparatus of the present invention not only accomplishes low-delay, high-quality echo cancellation, but also provides a multiple channel solution to the problem of echo resulting from the two-wire to four-wire hybrids and other echo sources found in telephony systems. In a preferred embodiment, the method and apparatus of the present invention uses the prior-art CSLMS/LMS techniques and operates on 8 kHz rate, 16 bit digital size samples, although it also can use different filter converging techniques and can be applied at different sampling rates and/or sample sizes.

Upon the onset of double-talk conditions, some divergence of the filter coefficients will occur. Thus, in a preferred embodiment of the present invention which achieves a multi-channel solution to echo cancellation, the method and apparatus of the present invention maintains filter history buffers for each channel so that a switch to a set of known "good" filter coefficients can be performed once double-talk is detected. For example, adaptive filter means 302 could store the filter coefficient history vector for every Nth frame (e.g., every +e,fra 160+ee th frame) into an M deep (e.g.

M=5) first-in-first-out (FIFO) vector bank. Multiple filter coefficient sets are stored for each channel in this manner. A set of filter coefficients can be recalled when double-talk detector 304 first detects double-talk for a particular channel to restore to a known "good" set of coefficients.

Figure 4:
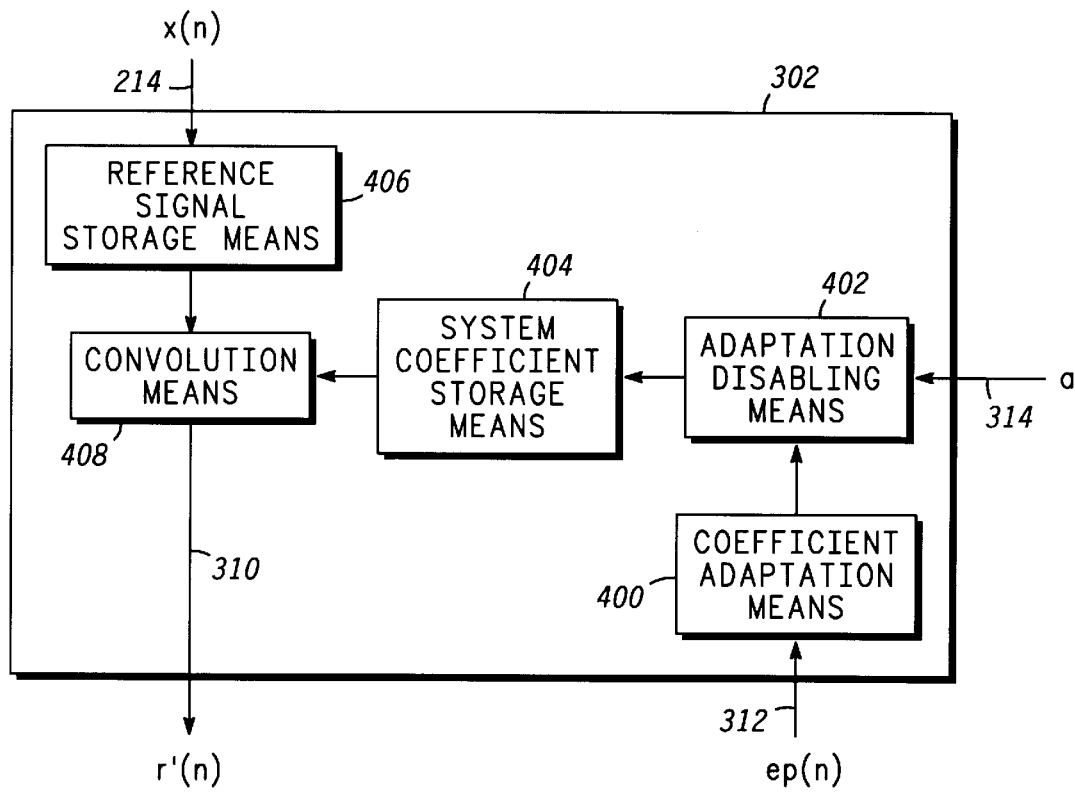
FIG. 4 illustrates a functional block diagram of an adaptive filter in accordance with a preferred embodiment of the present invention.

FIG. 4 illustrates a functional block diagram of adaptive filter means 302 in accordance with a preferred embodiment of the present invention. Adaptive filter means 302 includes coefficient adaptation means 400, adaptation disabling means 402, system coefficient storage means 404, reference signal storage means 406, and convolution means 408.

Coefficient adaptation means 400 adapts filter coefficients stored in system coefficient storage means 404 using CSLMS/LMS error minimization techniques as explained above. The adaptation is based on the pre-clip error signal, ep(n), received on line 312. Adaptation disabling means 402 is utilized when double-talk detector 304 (FIG. 3) indicates, on line 314, that double-talk is present This prohibits filter coefficient divergence caused by adaptation in the presence of a (non-echo) near-end signal. Reference signal storage means 406 stores the incoming reference signal samples from line 214. Convolution means 408 performs the filter operation by convolving the reference signal 406 with the echo impulse response system model 404 to produce the echo signal estimate r'(n) which is output on line 310.

Because of clock limitations, prior-art echo cancellers typically can not perform all calculations in a direct sequence real-time manner, and often impose long signal through-put delays due to buffering which is required to accommodate periodic increases in processing demands without losing data. Increases in processing demands can occur during filter coefficient history maintenance, and in support of related functions such as concentrated section filter partitioning, double-talk detection, and the center clipper procedure. For the purpose of describing a preferred embodiment of the present invention, the term pre-processing is applied to double-talk detection and other required calculations. Post-processing refers to center clipper functions, concentrated section filter partitioning, and other required calculations. Convolutional processing refers primarily to the filter operation and coefficient update process, and also includes various other related functions. It is the sequential nature and varying process requirements of the pre-, post-, and convolutional processing that necessitates the above described buffering and through-put delays found in prior-art solutions.

In a preferred embodiment, the method and apparatus of the present invention performs filter coefficient history storage, and pre/post processing concurrently with convolutional processing. This enables the method and apparatus of the present invention to achieve minimal delays which were not possible with prior-art echo cancellers. The concurrent processing of the method and apparatus of the present invention is described in detail in conjunction with FIGS. 5–8.

This concurrent processing enables the echo canceller of the present invention to perform echo cancellation in a near direct sequence real-time manner, significantly reducing system delays. In addition, the improvements provided by the present invention allow for simultaneous multiple channel echo cancellation using a single device. No prior-art echo canceller can provide multiple channel processing in a single device in the manner described herein. Multi-channel processing is achieved by using time multiplexing of components and one or more convolution processing units on the same integrated circuit. In addition, each convolution processing unit processes multiple channels.

Figure 5:
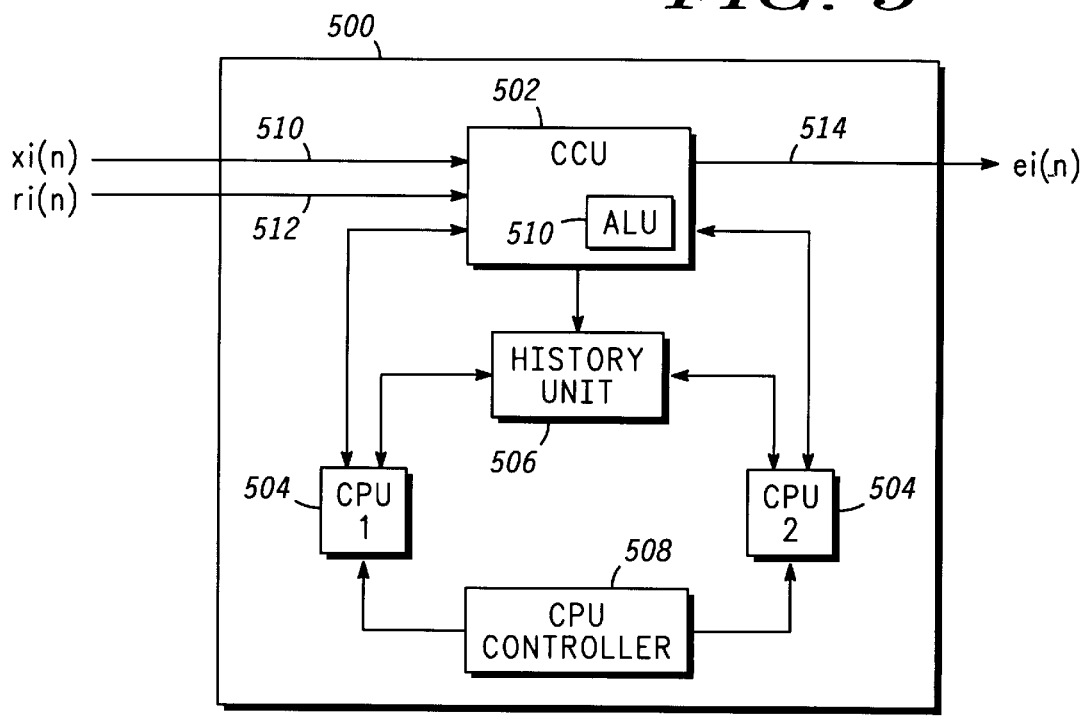
FIG. 5 illustrates a block diagram of a multi-channel echo canceller in accordance with a preferred embodiment of the present invention.

FIG. 5 illustrates a block diagram of multi-channel echo canceller 500 in accordance with a preferred embodiment of the present invention. In a preferred embodiment shown in FIG. 5 the functional echo canceller models described in conjunction with FIGS. 3 and 4 are incorporated into a multi-channel solution which addresses issues of integration, limited gate design, and high efficiency requirements. In alternate embodiments, multi-channel echo canceller 500 could be used with different types of echo canceller models.

The invention performs multiple independent channels of echo cancellation by sharing Central Control Unit 502 (CCU) with one or more Convolution Processing Units 504 (CPU) and Filter Coefficient History Unit 506. In a preferred embodiment, CCU 502, CPUs 504, and Filter Coefficient History Unit 506 perform functions of the echo canceller models described in conjunction with FIGS. 3 and 4.

In a preferred embodiment, CCU 502 performs functions associated with portions of adaptive filter means 302, double-talk detector means 304 and center clipper means 306, FIG. 3. Specifically, in a preferred embodiment, CCU 502 performs pre-processing, background tasks, and post-processing. Each will be explained below.

CCU 502 performs pre-processing of the reference signals, $x_i(n)$, and the reflected signals, $r_i(n)$, received on lines 510 and 512, respectively, where i represents a particular one of the processed channels. In a preferred embodiment, pre-processing includes high-pass filtering of the reference signals, determining when the "near-end" signal is active (i.e., whether double-talk exists), and calculating multipliers for CPUs 504. In alternate embodiments, other or different pre-processing functions could be performed.

Double-talk detection involves estimating energies of the reference signal and the reflected signal and comparing the two. When the comparison indicates that double-talk is present, CCU 502 sends a control signal to a CPU 504 which is processing the channel on which the double-talk exists. CCU 502 also performs background tasks, such as controlling filter coefficient history storage and recall according to a periodic or aperiodic schedule.

CCU 502 performs initial pre-processing function and then sends pre-processed (e.g., high-pass filtered) reference signal data, $x_i(n)$ and other control data to CPUs 504. CPUs 504 then perform the convolution and adaptive filter coefficient update calculations and return the results to CCU 502. In a preferred embodiment, these results take the form of one or more reflected signal estimates. CCU 502 completes the echo cancellation post-processing using the results from CPUs 504. Post-processing, in a preferred embodiment, includes calculation of the echo cancelled signal, multi-peak echo detection, and control of the filtering process when a multi-peak echo condition is present (i.e., controlling whether LMS or CSLMS is performed). CCU 502 utilizes Arithmetic Logic Unit 510 (ALU) for these computations. ALU 510 can be internal to or externally connected to CCU 502.

CCU 502 outputs an echo canceled, reflected signal, ei(n) on line 514. CCU 502 also controls History Unit 506 to save or recall filter coefficient data, when necessary. History Unit 506 provides storage for filter coefficient data.

CPUs 504 primarily perform functions associated with convolution means 308 (FIG. 4) of the adaptive filter means 302 (FIG. 3), and also perform certain related functions associated with the pre- and post-processing.

CPUs 504 receive the pre-processed reference signal data from CCU 502. In a preferred embodiment, CPUs 504 then perform a convolution process, adaptive filtering (see block 302, FIGS. 3, 4), calculations of the energy of the filter, and locating peak locations of the filter.

Each CPU 504 includes a multiply/accumulate process which accommodates the adaptive filter, coefficient updates, and energy calculations. CPUs 504 also receive control data from CPU 502 such as an indication that double-talk is occurring on a particular channel. CPUs 504 respond to such data, for example, by prohibiting filter adaptation during double-talk. CPUs 504 interact with History Unit 506 to store and recall filter coefficient data, when necessary.

In a preferred embodiment, each CPU 504 is capable of handling multiple channels of convolution calculations, filter coefficient updates, and energy calculations. The maximum number of channels which echo canceller 500 can simultaneously process is the sum of the number of channels that each CPU 504 can handle. In a preferred embodiment, CPUs 504 are controlled by CPU controller 508.

The apparatus of the present invention achieves numerous advantages over the prior art. First, sharing CPU 504, CCU 502, and ALU 510 resources among multiple channels reduces the number of gates necessary to achieve multichannel echo cancellation on a single integrated circuit. Second, CPU 504 and ALU 510 efficiencies can be highly optimized to accommodate numerous channels in real-time. Third, CCU 502 performs timing and control functions which allow CCU 502, CPUs 504, and History Unit 506 to work together in the proper sequence. This sequence is described in detail in conjunction with FIGS. 6–8.

Another advantage over prior-art echo cancellers is that, in accordance with the method and apparatus of the present invention, CPUs 504 can perform multiple convolutions and multiple filter coefficient updates within one sample time period. History Unit 506 also provides advantages over the prior art, in that it performs transfers of filter coefficients to/from memory and CPUs 504 without tying up processing resources of CCU 502.

CCU 502 performs timing functions which enable CCU 502, CPUs 504, and History Unit 506 to work together in the proper sequence. To meet real-time processing requirements, the echo cancellation processing for each sample of the reference signal data, x(n), and the reflected signal data, r(n), must be completed within a single sample period. In accordance with a preferred embodiment, segments of the processing are performed over multiple sample periods, but the throughput occurs in real-time. This is known as a pipe-line architecture.

Figure 6:
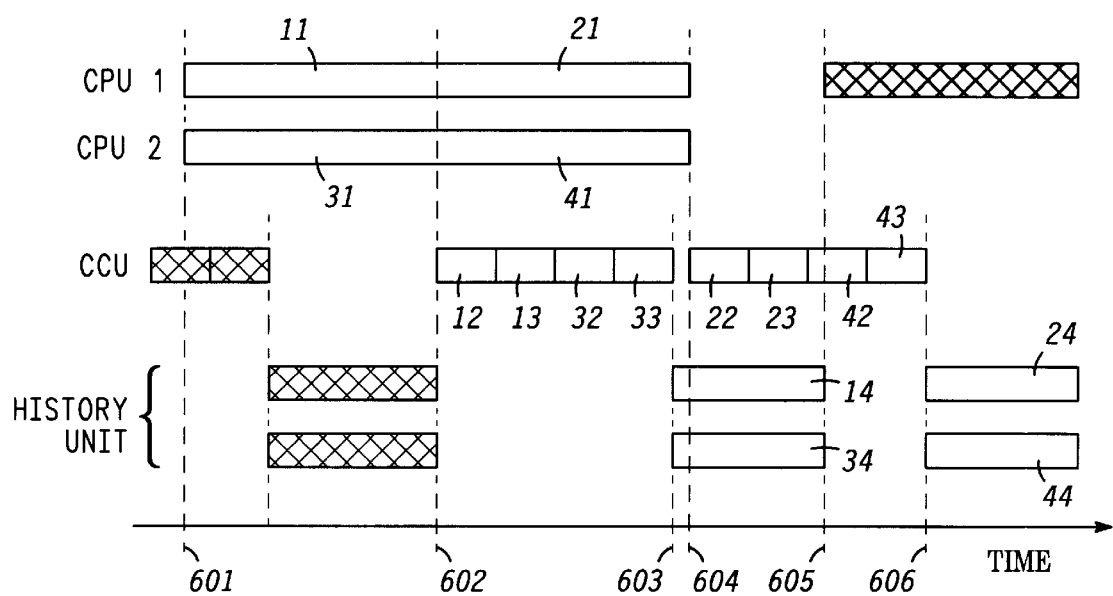
FIG. 6 illustrates an echo cancellation operation timing diagram in accordance with a preferred embodiment of the present invention.

FIG. 6 illustrates an echo cancellation operation timing diagram in accordance with a preferred embodiment of the present invention. For purposes of illustration, the ming diagram shows processing of four channels, although more or fewer channels could be processed. The pipelining illustrated in FIG. 6 shows how echo cancellation is performed in real-time and with minimal sample delays.

The timing configuration begins at time 601 when CPU 1 performs convolution processing 11 for channel 1, and CPU 2 performs convolution processing 31 for channel 3. At time 602, the completion of the convolution processing for channels 1 and 3, post-processing 12 is performed by the CCU for channel 1, followed by pre-processing 13 for a next set of data from channel 1. Post-processing 32 and pre-processing 33 is then performed for channel 3. Also at time 602, CPU 1 and CPU 2 begin convolution processing 21, 41 for channels 2 and 4. This occurs almost immediately following the completion of convolution processing for channels 1 and 3.

At time 603, when post- and pre-processing of channels 1 and 3 are completed, filter coefficient data for channels 1 and 3 can be saved and/or retrieved 14, 34 from the history unit. In a preferred embodiment, history saves and/or retrievals must be completed before convolution processing again begins at time 605 for channels 1 and 3. Likewise for channels 2 and 4, when the CPUs complete convolution processing 21, 41 at time 604, post-processing 22 and pre-processing 23 are performed for channel 2. Then post-processing 42 and pre-processing 43 are performed for channel 4. This is followed, at time 606, by filter coefficient saves and/or retrievals 24, 44 for channels 2 and 4. The timing procedure iterates for each channel as long as the channel is active.

Although FIG. 6 illustrates a timing diagram for four channels, the diagram could easily be modified to handle more or fewer channels. In addition, although a function for a particular channel is shown to be performed before a function for a different channel, these functions can be performed in different orders while achieving the same result. For example, post- and pre-processing for channels 1 and 3 need not be performed strictly in the order 12, 13, 32, 33. In an alternate embodiment, the processes could be performed, for example, in the order 32, 12, 33, 13. Other variations could be used and these variations are intended to be included within the scope of the invention. In other alternate embodiments, different channel groupings could be used. For example, instead of simultaneously processing channel 1 with channel 3, channel 1 could be simultaneously processed with channel 2 or channel 4. Alternatively, channel 1 could be separately processed, for example, when its companion channel is inactive. These alterations also are intended to be included within the scope of the present invention.

Figure 7:
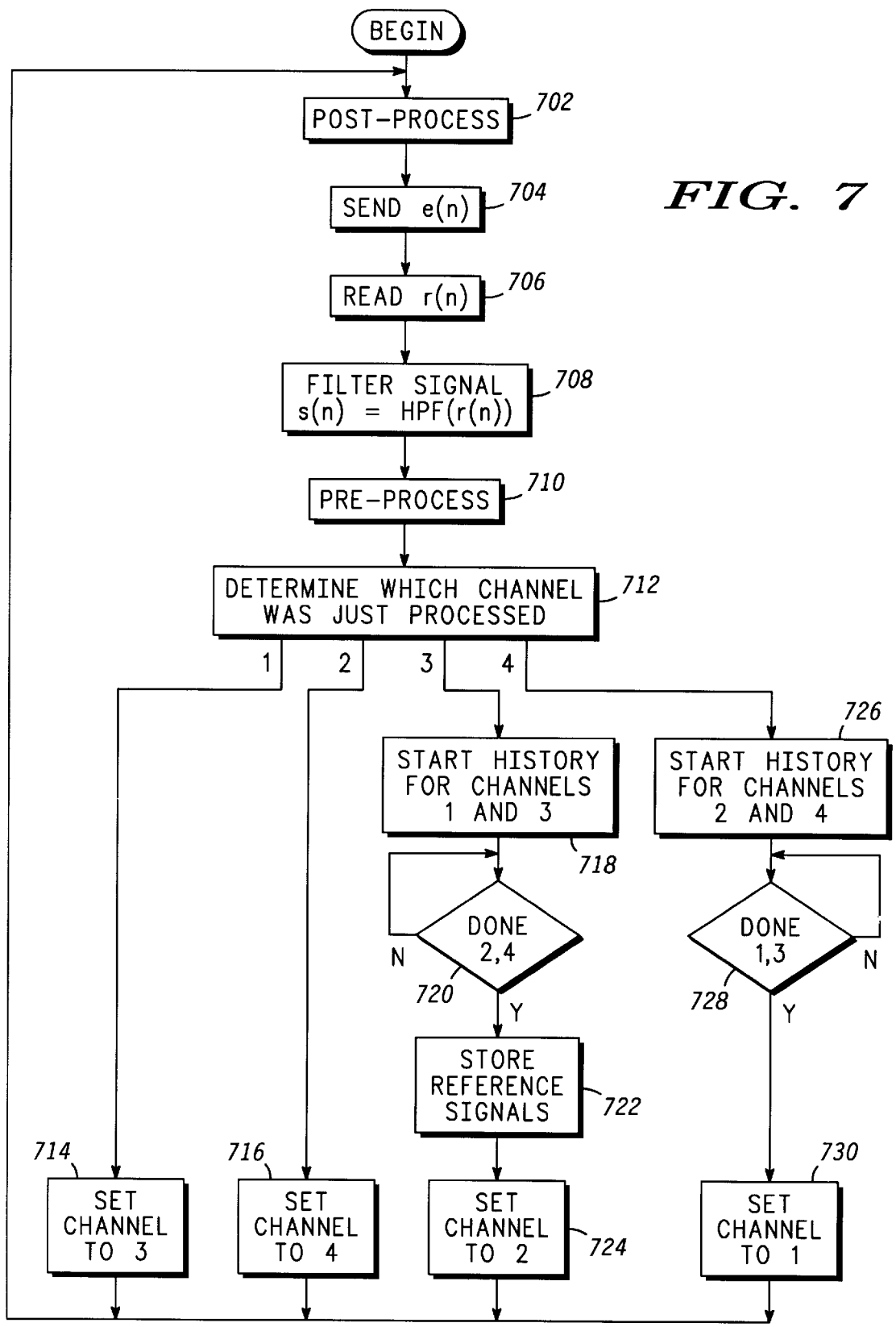
FIG. 7 illustrates a flowchart of a method for a Central Control Unit to control the timing of echo canceller operations in accordance with a preferred embodiment of the present invention.

FIG. 7 illustrates a flowchart of a method for a CCU to control the timing of echo canceller operations in accordance with a preferred embodiment of the present invention. The flowchart illustrates CCU control for four channels which are processed by two CPUs. In alternate embodiments, more or fewer channels and/or more or fewer CPUs could be used. The steps of the flowchart of FIG. 7 are performed when the echo canceller is turned on for all processed channels and all channels have been initialized and are active.

In a preferred embodiment, the multiple channels are processed in nearly the same sequence. Thus, the steps of the timing control process are shown to be performed during separate iterations for each of the channels. Prior to performing the steps, a channel is selected for processing. For ease of explanation, assume that channel 1 has been selected prior to performing step 702 during a first iteration. In an alternate embodiment, the multiple channel control could be performed in parallel.

The timing control process is iterative, so the flowchart can begin at almost any point. As described in conjunction with FIG. 6, post-processing for a particular signal frame of a given channel occurs just prior to pre-processing for a next signal frame of that same channel. Because post- and pre-processing for consecutive frames occurs within adjacent time windows, the flowchart of FIG. 7 begins with post-processing step 702, which corresponds to time 602 of FIG. 6.

In step 702, post-processing is performed for a signal frame of channel 1, and the output, e(n), is computed and sent to a near terminal in step 704. Post-processing involves all calculations performed by the CCU 502 (FIG. 5) and corresponding ALU 510 (FIG. 5) for a particular channel after (or post) convolution calculations performed by the CPU 504 (FIG. 5) for that channel. Specifically, calculations of the echo-cancelled signal, e(n), which is output on line 210 (FIG. 3), implementation of the center clipper means 306 (FIG. 3), multi-peak echo detection, and other processes can be performed during this processing phase.

Steps 706–710 represent pre-processing a next signal frame of channel 1. Pre-processing begins by reading the reflected signal, r(n), in step 706. Assuming that the filter is turned on, then the signal to be used during the convolution process, s(n), becomes the high-pass filtered (HPF) version of r(n) (i.e., HPF(r(n))), in step 708. Pre-processing is then performed on s(n) in step 710. Pre-processing involves all calculations performed by the CCU 502 (FIG. 5) and corresponding ALU 510 (FIG. 5) for a particular channel before (or pre) convolution calculations performed by the CPU 504 (FIG. 5) for that channel. Specifically, calculations of the energies of x(n) line 214 (FIG. 3) and r(n) line 212 (FIG. 3), implementation of the double-talk detector means 304 (FIG. 3), and filter coefficient multiplier determinations are performed during this processing phase.

Next, a determination is made, in step 712, of which channel has just been processed and the procedure branches accordingly. If channel 1 has just been processed, then processing continues by selecting, in step 714, channel 3 as the next channel to be processed, and performing steps 702–710 for channel 3. If channel 2 has just been processed, then processing continues by selecting, in step 716, channel 4 as the next channel to be processed, and performing steps 702–710 for channel 4.

If channel 3 has just been processed, then a command is sent to the history unit, in step 718, to begin saves and/or retrievals for channels 1 and 3. After step 718, the procedure waits, in step 720, for the Done 2,4 signal from the CPU which indicates that the convolution processing has been completed for channels 2 and 4. The Done 2,4 signal corresponds with time 604 (FIG. 6). When the Done 2,4 signal arrives, processing for all four channels has been completed and the reference data can be stored in the reference memory device (e.g., reference coefficient storage means 406, FIG. 4) for all four channels in step 722. The procedure then iterates as shown in FIG. 7, by selecting, in step 724, channel 2 as the next channel to be processed, and performing steps 702–710 for channel 2.

If channel 4 has just been processed, then a command is sent to the history unit, in step 726, to begin saves and/or retrievals for channels 2 and 4. After step 726, in step 728, the CCU waits for a Done 1,3 signal from the first CPU. The Done 1,3 signal corresponds with time 602 (FIG. 6) and indicates that the convolution processing is completed for channels 1 and 3. The procedure then iterates as shown in FIG. 7, by selecting, in step 730, channel 1 as the next channel to be processed, and performing steps 702–710 for channel 1.

The flowchart described above represents a preferred embodiment of the invention. Changes could be made to the flowchart which would have the same result as the flowchart described above. Such changes are meant to be incorporated within the scope of the present invention.

Figure 8:
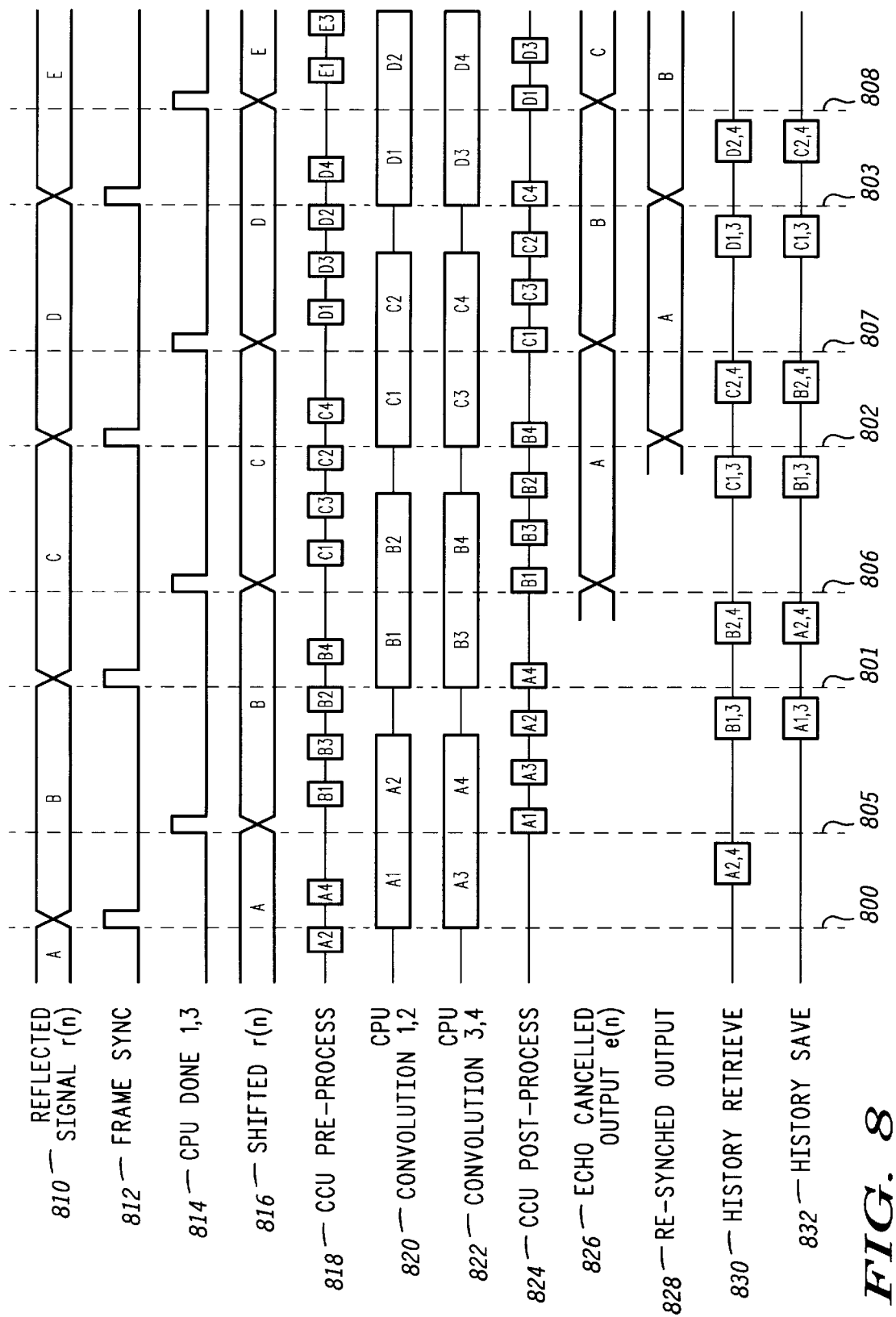
FIG. 8 illustrates a diagram of echo canceller pipeline delay in accordance with a preferred embodiment of the present invention.

FIG. 8 illustrates a diagram of echo canceller pipeline delay using a four channel configuration in accordance with a preferred embodiment of the present invention. The diagram can be correlated with the timing diagram illustrated in FIG. 6, although the timing of certain functions in FIG. 8 varies slightly from that of FIG. 6.

Vertical lines 800–803 represent the times of a frame sync 812 which occurs at the sample period (e.g., 8 kHz). The vertical lines 805–808 represent the times of an intermediate frame sync 814 which is derived from the Done 1,3 signal (see step 728, FIG. 7) from the CPUs.

The diagram shows a set of reflected signal data 810 as it is processed. The data is identified as "B" data, where "B1" represents B data for channel 1, "B2" represents B data for channel 2, "B3" represents B data for channel 3, and "B4" represents B data for channel 4. The reflected signal, r(n), is originally synchronized to frame sync 812. It is shifted, as indicated by shifted r(n) 816 to become synchronized to the CPU's Done 1,3 sync 814 so that all processing is synchronized to the CCU and CPU.

Next, pre-processing 818 is performed on all channels (in this example, four channels) as indicated by B1 through B4 along pre-processing flow 818. During pre-processing and prior to convolutional processing, history retrievals 830 are performed for channels 1 and 3.

While the CCU does pre-processing 818 for B2 and B4, the CPUs perform convolution processing 820,822 on B1 and B3. During this time, history retrievals 830 are performed for channels 2 and 4.

When this is completed, the CCU does post-processing 824 of B1 and B3 while the CPUs perform convolution processing 820,822 on B2 and B4. The CCU then performs post-processing 824 of B2 and B4, and history saves 832 are performed for all channels. The echo canceled outputs, e(n), for the channels are then synchronized 826 to the CPU Done 1,3 signal 814. Then the echo canceled outputs, e(n), are resynchronized 828 to the frame sync 812 and processing is completed.

The diagram of FIG. 8 illustrates that the method and apparatus of the present invention enables echo cancellation to be performed with substantially smaller delays than was possible with prior-art echo cancellers. Prior-art echo cancellers have long delays because they use only one DSP per channel to do all echo cancellation processing. Thus, prior-art echo cancellers must buffer data so that they can perform off-line processing (e.g., history dumps) without losing data. The method and apparatus of the present invention achieves minimal delay by performing pre- and post-processing concurrently with convolutional processing and history dumps. At an 8 kHz frame sync, the method and apparatus results in a total delay of 0.375 ms which represents only three sample delays.

In summary, a method and apparatus has been described which provides significant advantages over prior-art echo cancellers. The method and apparatus of the present invention can be used to replace multiple DSPs with memory and support circuitry with a single device which is capable of performing echo cancellation for multiple channels. This results in a significant reduction in circuit board real-estate and cosL The method and apparatus of the present invention also allows for integration on a custom ASIC with other telephony functions which would further decrease board real-estate and cost In addition, the method and apparatus of the present invention significantly reduces the delay associated with the echo canceller function by time-multiplexing the echo cancellation functions and components and by using multiple CPUs. The method and apparatus of the present invention is unique in that it can, in a preferred embodiment, perform different types of echo cancellation processing (e.g., LMS and CSLMS) for multiple channels. In addition, the echo canceller can be externally switched between the different types of processing (e.g., to LMS) when a multi-peak condition occurs on a particular channel.

The present invention has been described above with reference to preferred and alternate embodiments. However, those skilled in the art will recognize that changes and modifications could be made in these embodiments without departing from the scope of the present invention. For example, the processes and stages identified herein may be categorized and organized differently than described herein while achieving equivalent results. These and other changes and modifications which are obvious to those skilled in the art are intended to be included within the scope of the present invention.

What is claimed is:

1. An echo canceller apparatus wherein inputs to the echo canceller apparatus comprise a reference signal, and a reflected signal, and an output of the echo canceller apparatus is an echo cancelled signal, the echo canceller apparatus comprising:

a central control unit (CCU) for processing the reference signal and the reflected signal and sending the reference signal to a convolution processing unit (CPU), for receiving a reflected signal estimate as a result of a convolution process performed by the CPU, and for producing the echo cancelled signal based on the reflected signal estimate wherein the reference signal represents data from a first channel; and the CPU, coupled to the CCU, for receiving the reference signal and for performing the convolution process based on the reference signal, and returning the reflected signal estimate to the CCU. wherein during operation, the CCU simultaneously processes a reference signal for a second channel while the CPU performs the convolutional process on the reference signal for the first channel.

2. The echo canceller apparatus as claimed in claim 1, further comprising at least one additional CPU coupled to the CCU, wherein each of the at least one additional CPU is capable of performing functions of the CPU in parallel with the performance of the functions by the CPU.

3. The echo canceller apparatus as claimed in claim 1, wherein the CPU is capable of performing the convolution and adaptive process on multiple channels by time-multiplexing functions performed for each channel.

4. The echo canceller apparatus as claimed in claim 3, further comprising at least one additional CPU coupled to the CCU, wherein the CPU and the at least one additional CPU are controlled by the CCU so that echo cancellation for multiple channels can be performed in parallel.

5. The echo canceller apparatus as claimed in claim 1, wherein the CCU is further for determining whether double-talk exists within the reflected signal, and sending control data to the CPU which indicates that the double-talk exists, wherein the CPU is further for receiving the control data and prohibiting an adaptive process based on the control data.

6. The echo canceller apparatus as claimed in claim 1, wherein the CCU is further for determining whether a multiple-echo condition exists within the reflected signal, and for performing a first error minimization technique when the multiple-echo condition does not exist, and a second error minimization technique when the multiple-echo condition does exist.

7. The echo canceller apparatus as claimed in claim 6, wherein the first error minimization technique is a concentrated section least mean square technique.

8. The echo canceller apparatus as claimed in claim 6, wherein the second error minimization technique is a normalized least mean square technique.

9. The echo canceller apparatus as claimed in claim 1, further comprising a history unit coupled to the CPU, wherein the CPU can store and recall filter coefficients from the history unit.

10. The echo canceller apparatus as claimed in claim 1, further comprising a history unit coupled to the CCU, wherein the CCU can cause the history unit to store and recall filter coefficients.

11. An echo canceller apparatus for performing echo cancellation on multiple communication channels, wherein inputs to the echo canceller apparatus comprise multiple reference signals, and multiple reflected signals, and outputs of the echo canceller apparatus are multiple echo cancelled signals, the echo canceller apparatus comprising:

a central control unit (CCU) for processing the reference signals and the reflected signals and sending the reference signals to multiple convolution processing units (CPUs), for receiving reflected signal estimates as a result of convolution processes performed by the multiple CPUs, and for producing the echo cancelled signals based on the reflected signal estimates; and the multiple CPUs coupled to the CCU, each of the multiple CPUs for receiving a reference signal and for performing a convolution and adaptive process based on the reference signal, the reflected signal, an error signal, current filter coefficients, and the control data, and returning a reflected signal estimate as a result to the CCU, wherein each of the multiple CPUs are capable of performing the convolution and adaptive process independently so that echo cancellation for multiple channels can be performed in parallel.

12. The echo canceller apparatus as claimed in claim 11, wherein each of the multiple CPUs are capable of processing at least two of the multiple communication channels by time-multiplexing echo cancellation functions.

13. The echo canceller apparatus as claimed in claim 11, wherein the CCU and the multiple CPUs are co-located on a single integrated circuit.

14. The echo canceller apparatus as claimed in claim 11, wherein the CCU is further for performing timing and control functions to enable the CCU and the multiple CPUs to perform echo cancellation processing on the multiple channels.

15. A central control unit (CCU) of an echo canceller for performing timing and control functions which enable the echo canceller simultaneously to process more than one communication channel, the central control unit performing the timing and control functions by executing a repeating sequence of steps which comprise pre-processing a reference signal and a reflected signal obtained from a first channel, causing a convolution processing unit (CPU) to perform a first convolution process for the reference signal, and post-processing a reflected signal estimate received from the CPU as a result of the first convolution process to produce an echo cancelled signal, wherein during operation, the CCU causes a second CPU to perform a second convolutional process for a reference signal obtained from a second channel simultaneously with causing the first convolutional process.

16. The CCU as claimed in claim 15, wherein the CCU is further for causing filter coefficients derived from the first convolution process to be saved.

17. The CCU as claimed in claim 15, wherein the CCU is further for performing the timing and control functions for at least one additional CPU so that multiple channels can be processed simultaneously.

18. The CCU as claimed in claim 15, wherein the CCU is further for performing additional timing and control functions which enable the CPU to process a second channel, the additional timing and control functions comprising steps of pre-processing a second reference signal and a second reflected signal obtained from the second channel prior to causing the CPU to perform the first convolution process, causing the CPU to perform a second convolution process for the second reference signal while the CPU is performing post-processing for the first channel, post-processing a reflected signal estimate received as a result of the second convolution process while the CPU is causing the filter coefficients derived from the first convolution process to be saved, and causing second filter coefficients derived from the second convolution process to be saved while the CPU is performing the first convolution process on a next reference signal from the first channel.

19. The CCU as claimed in claim 15, wherein the CCU is further for performing additional timing and control functions which enable a second CPU to process a second channel, the additional timing and control functions comprising steps of pre-processing a second reference signal and a second reflected signal obtained from the second channel, causing the second CPU to perform a second convolution process while the CPU is performing the first convolution process for the first channel, post-processing a second reflected signal estimate received from the second CPU as a result of the second convolution process, and causing second filter coefficients derived from the second convolution process to be saved.

20. A method for echo cancellation for at least one communication channel, the method comprising the steps of:
   a) determining whether a convolution processing unit (CPU) of multiple CPUs is available to perform a convolution process for a reference signal and a reflected signal for a particular channel;
   b) when the CPU is available, waiting for a reflected signal estimate to be returned by the CPU while simultaneously determining whether a second CPU of the multiple CPUs is available to perform a second convolutional process;
   c) post-processing the reflected signal estimate to produce an echo cancelled signal; and
   d) repeating steps a) through d).

21. The method as claimed in claim 20, further comprising the step of:
   e) performing other tasks while the CPU performs the convolution process.

22. The method as claimed in claim 21, wherein the step of performing the other tasks comprises the steps of:
   e1) pre-processing the reference signal and the reflected signal.

23. The method as claimed in claim 20, further comprising the steps of:
   e) reading the reference signal for the particular channel; and
   f) sending the reference signal to the CPU.

24. The method as claimed in claim 20, further comprising the steps of:

e) determining, by the CCU, whether a second CPU is available to perform a second convolution process for a second reference signal and a second reflected signal from a second channel;
   f) when the second CPU is available, waiting for a second reflected signal estimate to be returned from the second CPU;
   g) causing second filter coefficients from the second convolution process to be stored; and
   h) repeating steps e) through h).

25. The method as claimed in claim 24, further comprising the steps of:
   j) reading the second reference signal for the second channel; and
   k) sending the second reference signal to the second CPU.

26. A method for echo cancellation for at least one communication channel, the method comprising the steps of:
   a) reading a first reference signal and a first reflected signal for a first channel;
   b) reading a second reference signal and a second reflected signal for a second channel;
   c) pre-processing the first reference signal, the first reflected signal, the second reference signal, and the second reflected signal;
   d) simultaneously performing convolution processing on the first reference signal, the first reflected signal, the second reference signal, and the second reflected signal using a first convolution processing unit (CPU) and a second CPU, resulting in a first reflected signal estimate and a second reflected signal estimate; and
   e) post-processing the first reflected signal estimate and the second reflected signal estimate, resulting in a first echo cancelled signal and a second echo cancelled signal.

27. The method as claimed in claim 26, further comprising the steps of:
   f) reading a third reference signal and a third reflected signal for a third channel;
   g) reading a fourth reference signal and a fourth reflected signal for a fourth channel;
   h) preprocessing the third reference signal, the third reflected signal, the fourth reference signal, and the fourth reflected signal;
   i) simultaneously with performing post-processing step e), performing convolution processing on the third reference signal, the third reflected signal, the fourth reference signal, and the fourth reflected signal using the first CPU and the second CPU, resulting in a third reflected signal estimate and a fourth reflected signal estimate; and
   j) post-processing the third reflected signal estimate and the fourth reflected signal estimate, resulting in a third echo cancelled signal and a fourth echo cancelled signal.

* * * * *